United States Patent [19]
Dennison

[11] Patent Number: 5,100,838
[45] Date of Patent: Mar. 31, 1992

[54] METHOD FOR FORMING SELF-ALIGNED CONDUCTING PILLARS IN AN (IC) FABRICATION PROCESS

[75] Inventor: Charles Dennison, Boise, Id.
[73] Assignee: Micron Technology, Inc., Boise, Id.
[21] Appl. No.: 594,424
[22] Filed: Oct. 4, 1990
[51] Int. Cl.⁵ .......................................... H01L 21/283
[52] U.S. Cl. ............................. 437/195; 437/50; 437/228; 437/229; 437/984; 148/DIG. 106
[58] Field of Search ................... 437/41, 44, 187, 189, 437/195, 48, 50, 52, 984, 228, 229; 148/DIG. 106; 430/311

[56] References Cited

U.S. PATENT DOCUMENTS

| | | | |
|---|---|---|---|
| 3,753,774 | 8/1973 | Veloric | 117/212 |
| 4,458,410 | 7/1984 | Sugaki | 29/591 |
| 4,808,552 | 2/1989 | Anderson | 437/195 |
| 4,868,138 | 9/1989 | Chan et al. | 437/189 |
| 4,871,688 | 10/1989 | Lowrey | 437/47 |
| 4,957,881 | 9/1990 | Crotti | 437/195 |
| 4,997,790 | 3/1991 | Woo et al. | 437/195 |
| 5,037,777 | 8/1991 | Mele et al. | 437/195 |

FOREIGN PATENT DOCUMENTS

| | | | |
|---|---|---|---|
| 58-115859 | 7/1983 | Japan | 437/41 |
| 1-187862 | 7/1989 | Japan | 437/984 |
| 2-35718 | 2/1990 | Japan | 437/50 |
| 2-126684 | 5/1990 | Japan | 437/984 |

OTHER PUBLICATIONS

Wei et al., "The use of selective silicide plugs for submicron contact fill"; Jun. 12, 1989, VMIC Conference. pp. 136-143.
Yamazaki et al., "Selective CVD tungsten contact plug technology"; Jun. 12, 1989, VMIC Conference. pp. 151-157.
Hamajima et al., "Low contact resistance polysilicon plug for halfmicron CMOS technology"; Jun. 12, 1989, VMIC Conference. pp. 144-150.

Primary Examiner—T. N. Quach
Attorney, Agent, or Firm—Stephen A. Gratton

[57] ABSTRACT

A method of forming conducting pillars in a semiconductor integrated circuit which are defined by insulating spacers of a previous conducting layer. The method includes the steps of forming parallel-spaced conductor lines on a silicon substrate having spaces therebetween; forming insulating spacers on the sidewalls of the conductor lines while leaving a gap between the lines; filling the gaps with a conductor film and etching the film to form conducting pillars; and photo-etching contact vias to the conducting pillars for forming a multilevel interconnect between the conductor lines and another conductor.

13 Claims, 4 Drawing Sheets

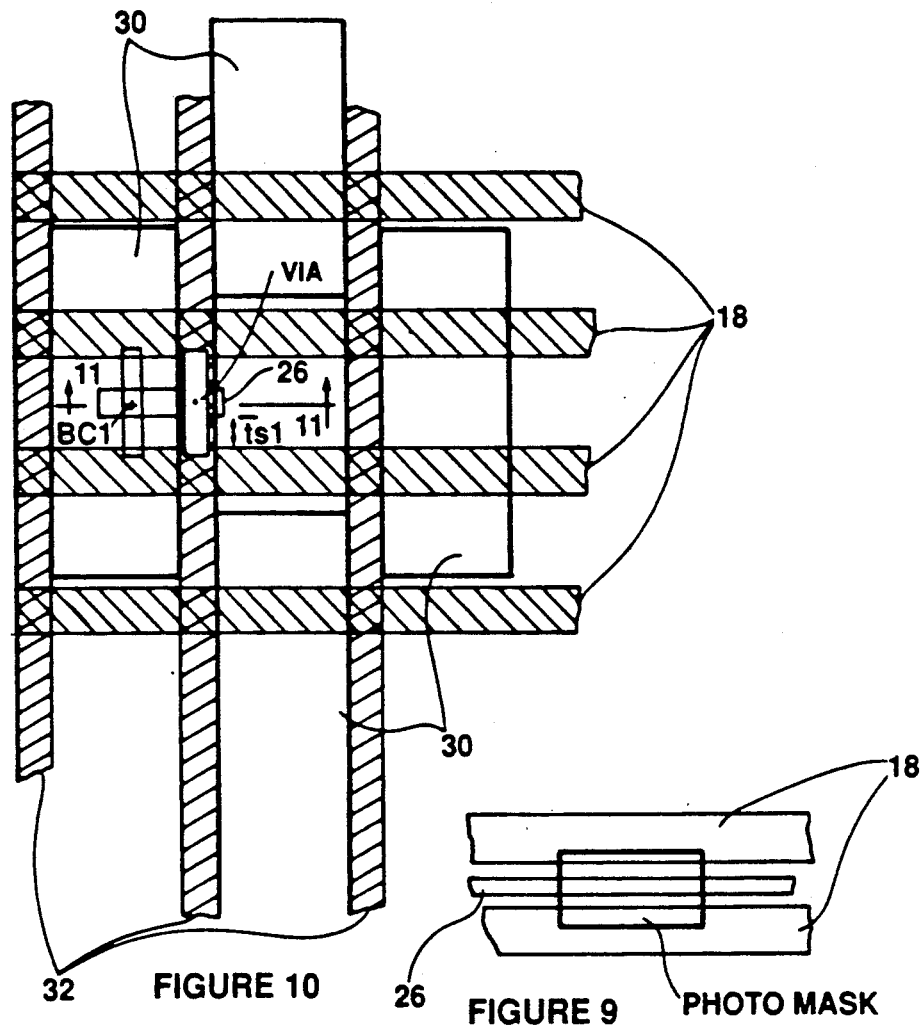
FIGURE 10
FIGURE 9
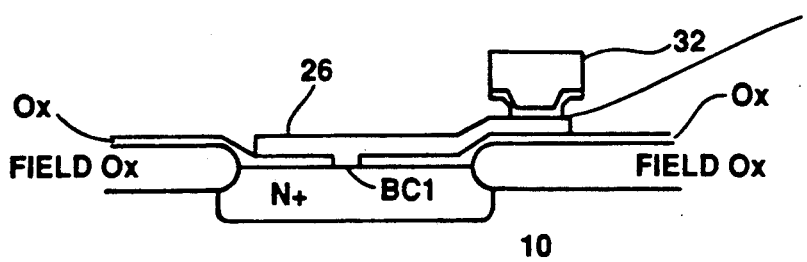
FIGURE 11

METHOD FOR FORMING SELF-ALIGNED CONDUCTING PILLARS IN AN (IC) FABRICATION PROCESS

FIELD OF THE INVENTION

The present invention relates to semiconductor devices and, more particularly, to a novel method for forming conducting pillars which are defined by insulating spacers of a previous conducting layer in an (IC) fabrication process.

BACKGROUND OF THE INVENTION

In the formation of integrated circuits, silicon technology for ultra-large scale integration (ULSI) has advanced to the point where several million devices may be included on a single semiconductor wafer die. In order to achieve such high device packing densities, multilevel interconnects are required. In general, a multilevel interconnect may be required to connect separate devices or conductors located in spatially separated planes on the wafer. It may be necessary, for instance, to connect a conductor line or buried contact on a first plane of the wafer with a second conductor line on a second plane of the wafer (either above or below). This process is often referred to as planarization of wafer topography.

In the past, during semiconductor fabrication, contact plugs have been deposited in holes or trenches in an oxide layer. These contacts formed or planarized by techniques such as chemical vapor deposition CVD. In general, contact hole planarization remains among the most difficult and critical semiconductor fabrication processes. Among the problems are high Si consumption, poor film adhesion, and loss of selectivity on dielectrics.

Planarization methods involving selective CVD tungsten as a contact plug are often utilized. These processes are difficult to stably reproduce. Additionally, with these processes, it is often difficult to achieve low contact resistance on P-type diffusion layers.

The present invention is directed to a novel method in which the contact plugs rather than being defined by holes or trenches in the oxide are defined by oxide spacers of prior conducting layers. This method overcomes many of the aforementioned prior art problems and forms conducting pillars which can be self-aligned with respect to other conductors.

SUMMARY OF THE INVENTION

In accordance with the present invention, a method for forming self-aligned conducting pillars in an (IC) fabrication process is provided. The conducting pillars are defined by insulating spacers between adjacent conductors of a prior formed conducting layer.

The invention uses various materials which are electrically either conductive, insulative, or semiconductive, although the completed device is referred to as a semiconductor. One of the materials used is polysilicon, referred to as "poly". Another material used is oxide which is an insulator and identified in the drawings as "ox".

The method of the invention generally stated includes the steps of:
forming parallel spaced conductor lines on a substrate with spacers therebetween;
forming insulating spacers on the sidewalls of the conductor lines leaving gaps between the spacers;
conformally depositing a conductor film into the gaps;
blanket etching the conductor film to define conducting pillars; and
photo-etching contact vias to the conducting pillars and to form an interconnect with other conductors.

The method of the invention allows relatively small contacts such as buried contacts on the order of about 0.3 micron to be efficiently aligned with another conductor. Additionally, the method of the invention provides conformally insulated spacers between adjacent conductor lines for improved photo-patterning and etching of subsequent film layers.

Other objects, advantages, and capabilities of the present invention will become more apparent as the description proceeds.

BRIEF DESCRIPTION OF THE DRAWINGS

FIG. 9 is a plan view of a portion of a semiconductor wafer during a processing step in accordance with the invention in which a photo-mask is aligned with the conductor lines;

FIG. 10 is a plan view of a portion of a semiconductor wafer processed in accordance with the invention;

FIG. 11 is a cross-sectional view taken along section line 11—11 of FIG. 10;

DETAILED DESCRIPTION OF THE INVENTION

Figure 1:
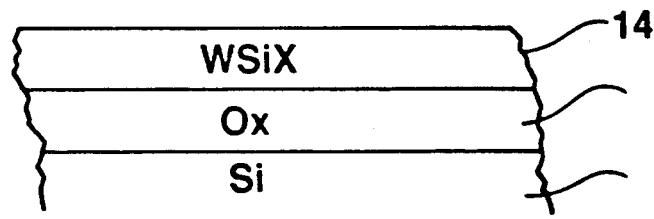
FIG. 1 is a cross-section of a portion of a semiconductor wafer during a processing step in accordance with the invention in which a conductor layer is formed on a substrate.

Referring now to FIGS. 1-10, the method of the invention generally stated includes the steps of:

Step 1—depositing a conducting layer 14 on a substrate 10 (FIG. 1). The substrate 10 may include active and isolation regions and a gate oxide 12.

Figure 2:
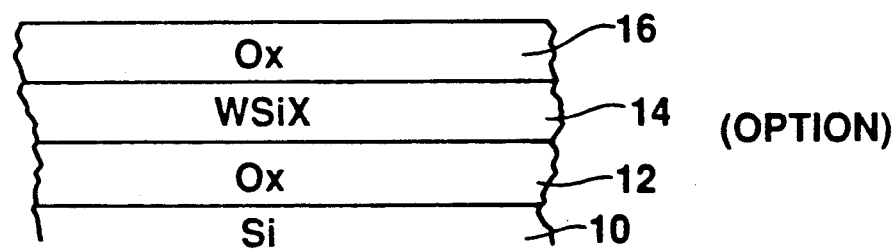
FIG. 2 is a cross-section of a portion of a semiconductor wafer during a processing step in accordance with the invention in which an oxide layer is formed on the conductor layer.

Step 2—depositing an insulation or oxide layer 16 over the conducting layer 14 (FIG. 2). (This is an optional step.)

Figure 3:
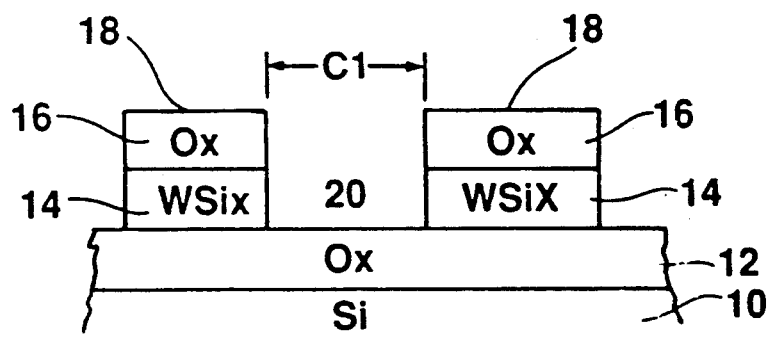
FIG. 3 is a cross-section of a portion of a semiconductor wafer during a processing step in accordance with the invention in which spaces are formed between the conductor lines.

Step 3—forming conducting lines 18 (conductor 1) with spaces 20 therebetween (FIG. 3). This may be done by conventional photo-etch processes. A width C1 of the space 20 between the conductor lines 18 must be closely controlled as will hereinafter be explained.

Figure 4:
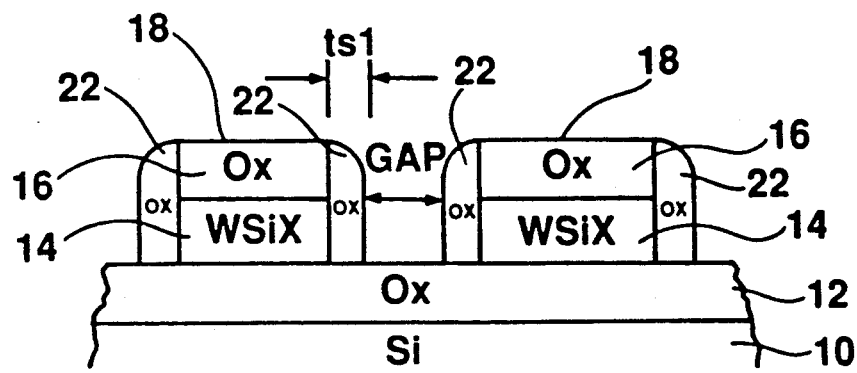
FIG. 4 is a cross-section of a portion of a semiconductor wafer during a processing step in accordance with the invention in which a insulating spacers are anisotropically formed on the sidewalls of the conductor lines leaving a gap therebetween.

Step 4—conformally depositing and anisotropically etching an insulating film or oxide on the sidewall of the conductor lines 18 to form insulating spacers 22 therebetween (FIG. 4).

Step 5—additional insulating layers may also be deposited, and contact vias and buried contacts BC1 may be photo-etched into the substrate (FIG. 5), as an optional step.

Figure 6:
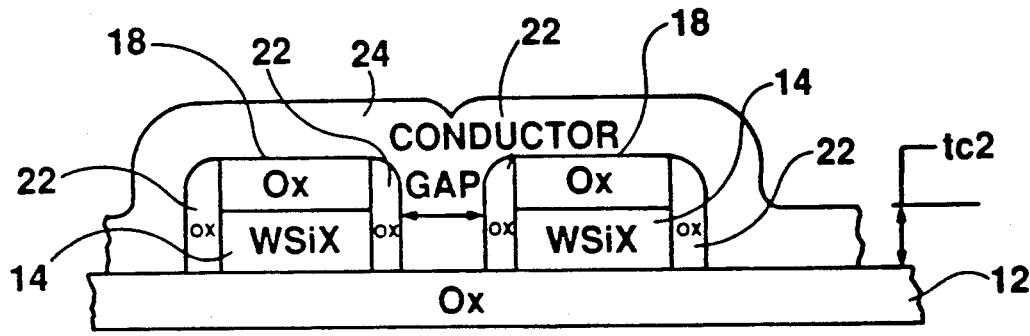
FIG. 6 is a cross-section of a portion of a semiconductor wafer during a processing step in accordance with the invention in which a conductor film is deposited into the gaps previously formed between conductor lines.

Step 6—conformally depositing a conducting film 24 (conductor 2) having a thickness (tc2) greater than one-half of the gap between the conductor lines 18 such that the conducting film 24 completely fills the gap (FIG. 6).

Figure 7:
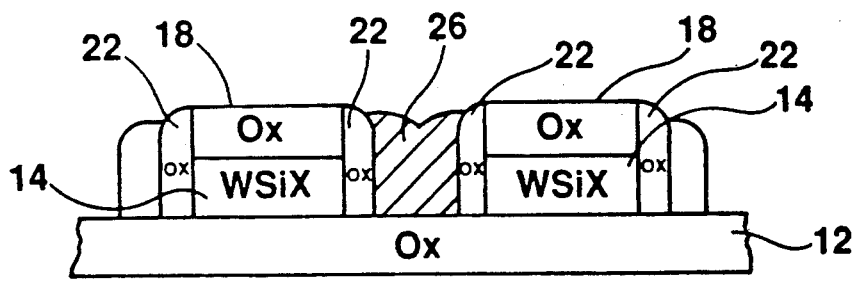
FIG. 7 is a cross-section of a portion of a semiconductor wafer during a processing step in accordance with the invention in which a conducting pillar is formed after blanket etching the conductor film previously deposited.

Step 7—blanket etching the conductor film 24 (conductor 2) stopping the etch after etching approximately a thickness of (t2) leaving all the gaps filled with conducting plugs or pillars 26 (FIG. 7). The height of the conducting pillars 26 is defined by the amount of overetch and by the height of the previous conductor lines 18 (conductor 1).

Figure 8:
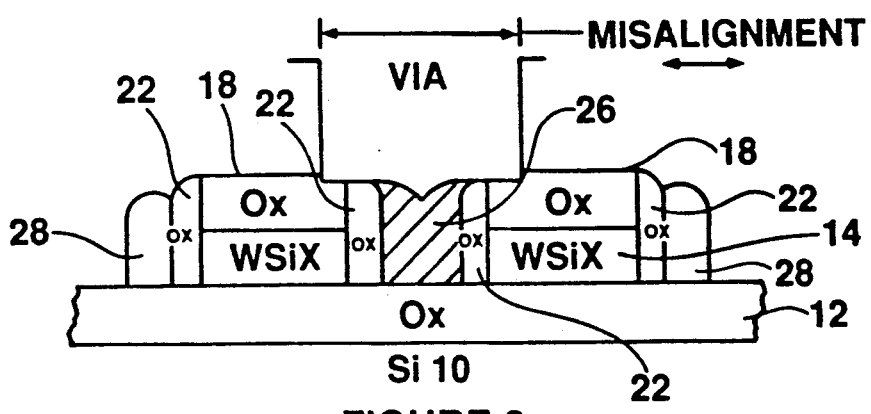
FIG. 8 is a cross-section of a portion of a semiconductor wafer during a processing step in accordance with the invention in which a contact via is formed on the conducting pillar.

Step 8—photo-etching the conducting pillars 26 over-sizing the photo-mask parallel to the conducting pillars 26 thereby self-aligning the conducting pillars 26 to the conducting lines 18 (conductor 1) (FIG. 8). Additionally, conducting spacers 28 left along the sidewalls of the conducting lines can be left intact and patterned for use as conductors or removed in accordance with step 9.

Step 9—conformally depositing an oxide and blanket etching to fill the remaining gaps formed in step 3 (not shown). All of the spaces initially formed in step 3 are thus either filled with a conductor or an insulator, and any regions where there was a space between adjacent lines is now completely conformal.

Step 10—forming a multilevel interconnect between the conducting pillars 18 and another conductor line 32 (FIG. 10).

Step 11—optionally depositing an additional insulator (not shown); and

Step 12—optionally photo-etching contact vias through the oxide formed in step 2 for contact with conductor 1 (not shown).

With reference to FIGS. 1-10, the process of the invention will now be explained in more detail. As a starting wafer, a silicon substrate 10 may be doped to provide P-type or N-type regions as required. A LOCOS initial oxide layer may be utilized as the gate oxide in active region. As a first step in accordance with the process of the invention, a conducting film 14 is deposited on the oxide layer 12. This is shown in FIG. 1. The conducting film 14 may be chemical vapor deposited (CVD) sputtered or otherwise formed on the oxide layer 12. The conducting film 14 may be any suitable conductor such as a metallic film or a composite film comprising a metallic film on a polysilicon layer. In the illustrative embodiment of the invention, this conducting film 14 is tungsten silicide (WSiX) deposited on polysilicon film (poly) and is labeled as WSiX throughout. This is conductor 1.

As a second step (FIG. 2), an insulator in the form of an oxide 16 layer is formed on the conducting film 14. The formation of this oxide 16 is necessary to the practice of the invention but may optionally be accomplished at a different point in the process. It is thus labeled as an option in FIG. 2.

As a third step (FIG. 3), the composite film 14,16 is photo-etched to form parallel-spaced conducting lines 18. Each conducting line 18 is formed with generally spaced, parallel sidewalls. Each pair of conducting lines 18 is separated by a space 20 having a width C1. A photo pattern mask formed of a photo-resistant material and an oxide etch can be utilized to cut the spaces 20 by techniques which are known in the art. The width C1 of each space 20 between the conductor lines 18 can be formed in accordance with specific parameters to be hereinafter explained.

As a fourth step (FIG. 4), an oxide layer is conformally deposited and anisotropically etched to form straight vertical insulating spacers 22 along the sidewalls of each conducting line 18. Adjacent insulating spacers 22 are parallel to one another and are formed with a thickness (ts1) which leaves a gap in the space 20 between the conducting lines 18. As an illustration, the gap can be on the order of about 0.3 micron. The width of the gap can be calculated by subtracting twice the thickness (ts1) of the spacers 22 from the width C1 of space 20 (FIG. 3) between the conducting lines 18. (GAP=C1−(2×ts1)). If an insulator 16 is not deposited in step 2, then an etch-back is not required and the insulation of step 4 can be left on a top surface of the conductor lines 18. It is necessary, however, to have an insulator formed on a top surface of the conducting pillars 18. Additionally, another insulating film may be deposited as an optional step (not shown).

Figure 5:
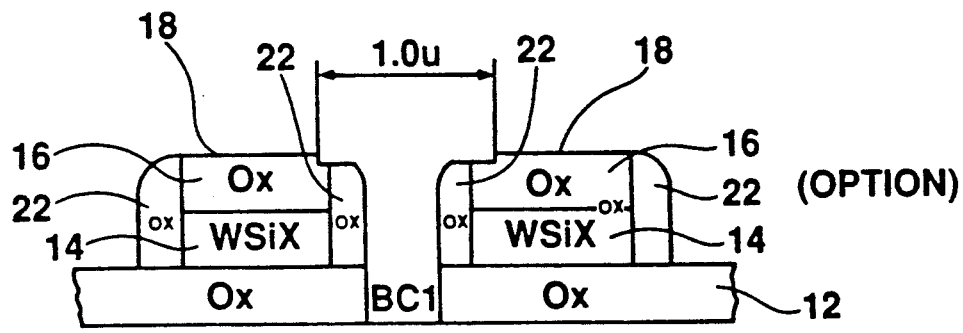
FIG. 5 is a cross-section of a portion of a semiconductor wafer during a processing step in accordance with the invention in which a buried contact is formed on a silicon substrate.

As a fifth step (FIG. 5), a buried contact BC1 may be formed within the gap between conducting lines 18. This buried contact BC1 may be formed by a conventional photo-etch process in which a photo-pattern and oxide etch are used to cut vias or contacts which form the buried contact BC1. As shown in FIG. 5 and as an illustrative example, this via may have a width which is on the order of about 1.0 micron. Step 5 is an option which need not be performed if other contact routes into the substrate 10 are available.

As a sixth step (FIG. 6), a conducting film 24 (conductor 2) is conformally deposited over the conducting lines 18 and into the gap between the conducting lines 18. The thickness tc2 of the conducting film 24 must be greater than one-half of the gap size such that the film completely fills the gap (tc2 > ½ GAP).

With reference to FIG. 3, it can also be stated that the space 20 between the conducting lines 18 must have a width C1 less than twice the thickness (ts1) of the insulating spacers 20 (FIG. 4) plus the thickness (tc2) of the conducting film 24 (FIG. 6). C1 of space 20 < 2×(ts1+tc2).

Additionally, the space 20 (FIG. 3) formed in step 3 must have a width C1 greater than twice the thickness (ts1) of insulating spacers 20. C1 > 2 (ts1). These formula can be utilized in sizing the respective films and in forming the original spaces between the conducting lines 18 and the gaps between the insulating spacers 22 which is critical to the practice of the invention.

As a seventh step (FIG. 6), conductor film 24 previously deposited in step 6 is blanket etched. The etch must be controlled to stop the etch after the thickness (tc2) has been removed. As shown in FIG. 7, the gap between conducting lines 18 is now filled with a conducting pillar 26. The height of the pillar 26 is determined by the amount of over-etch in step 6 and by the height of the conducting lines 18 formed in step 3.

As an eighth step (FIG. 8) contact vias can be formed onto the conducting pillars 18 by conventional photo-etch processes as previously described. A critical feature of this process is shown in plan view in FIG. 9. For forming the contact vias, a photo-mask can be placed over a conducting pillar 26 and over-sized to extend parallel to and into the conducting lines 18. The location of this photo-mask is clearly shown in FIG. 9. This cuts a via into the conducting pillar 26 which as shown in FIG. 8, can be misaligned but still maintain contact with the conducting pillar 26. Since the conducting pillars 26 or a buried contact (FIG. 5) below the conducting pillar 26 may be on the order of 0.3 micron in width and the via on the order of 1 micron in width, a significant alignment advantage is obtained. This automatically self-aligns the conducting pillars 26 to the previously formed conducting lines 18. The formation of this contact via allows the conducting pillars 26 to function as a multilevel interconnect as shown in FIG. 11 between a different conductor line 32 (conductor 3).

As an optional step, the conducting pillar 18 formed on either side of the conductor lines 14 can be anisotropically etched and filled with an insulator 28 (FIG. 8). Alternately, the conducting pillars 18 on either side can be left intact and patterned for use as conductors. All the gaps between the conductor lines 14 are thus either filled with a conductor or an insulator. Additionally, any regions where gaps were formed between conductors 14 are now completely conformal. This allows photo-patterning and etching of subsequent layers to be more easily and efficiently accomplished.

As additional optional steps, another insulating film may be deposited and further contacts and vias can be photo-patterned. If oxide layers 12 formed in step 2 is thick enough, then the contact vias of this etch will be self-aligned to the conducting pillars 26, i.e., the contact via can be misaligned or over-sized with respect to the conductor lines 14 and still only contact will be made to the conducting pillars 26.

Referring now to FIG. 10, a specific application for the process of the invention is illustrated. In FIG. 10, a starting wafer has a pattern of active areas 30 formed thereon. The active areas 30 are located where preferably all active devices are found on the semiconductor. A semiconductor wafer, for instance, may be divided into a plurality of dice each of which die have approximately 128K of active areas 30 formed thereon. A plurality of parallel-spaced conductor lines 18 form a gate mode of transistors in the active areas 30. These conductor lines 18 may be formed as previously explained and may be utilized, for instance, as "word lines". Additionally, the wafer may include a plurality of parallel-spaced conductor lines 32 generally perpendicular to and in a different plane than conductor lines 18 which can be utilized as, for instance, digit lines.

In some applications, it may be desirable to achieve a multilevel interconnect between a buried contact BC1 on the wafer substrate and to the digit lines 32. This can be accomplished as shown in FIG. 11 by the conducting pillars 26 formed in accordance with the invention. In general, the conducting pillars can be formed in accordance with the invention and self-aligned as previously described to the buried contacts and various contact vias.

Figure 12:
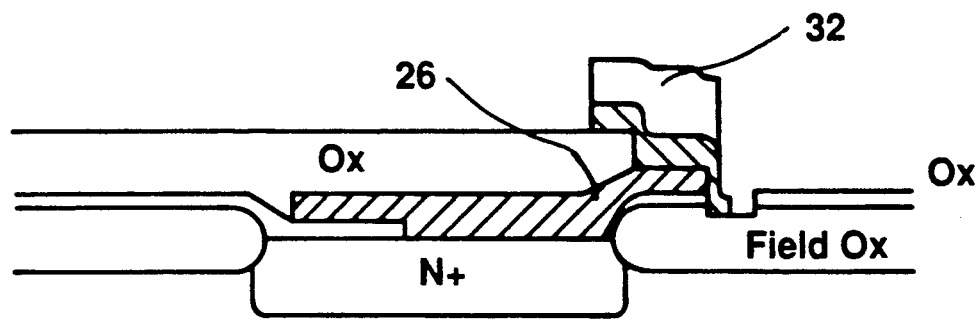
FIG. 12 is a cross-sectional view illustrating another contact made in accordance with the invention.
Figure 13:
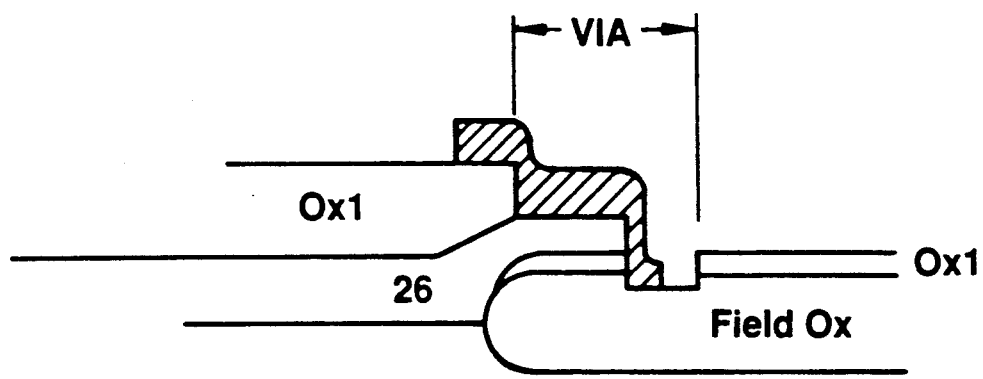
FIG. 13 is an enlarged view of a portion of FIG. 11.

FIGS. 12 and 13 illustrate another application in which a conducting pillar 26 formed in accordance with the invention provides a multilevel interconnect to a digit line 32.

Thus, the invention provides a novel process in which self-aligned conducting pillars can be formed by the insulating spacers of a previous conducting layer. What has been described are very specific steps in conjunction with preferred embodiments and applications of the invention. As will be apparent to those skilled in the art, other steps may be taken within the scope of the invention in order to accomplish either the same or different circuit results. Accordingly, the invention should be read only as limited by the claims.

What is claimed is:

1. A method of forming parallel spaced conducting pillars in a semiconductor integrated circuit comprising:
   depositing a conducting layer (conductor 1) on a silicon substrate having an insulating layer formed thereon;
   depositing an insulator on the conducting layer;
   photo-etching the conducting layer to form separate parallel spaced conductor lines with spaces having a width of C1 therebetween;
   conformally depositing and anisotropically etching an insulating film on the sidewalls of the parallel spaced conductor lines to form insulating spacers on the conductor lines while leaving gaps between the insulating spacers;
   depositing a conducting film (conductor 2) over the parallel spaced conductor lines and into the gaps to a thickness of tc2 which completely fills the gaps;
   blanket etching the conducting film stopping the etch after etching approximately a thickness of tc2 to form planarized conducting pillars within the gaps;
   photo-etching to form contact vias to the conducting pillars over-sizing a photo mask in a direction parallel to the parallel spaced conducting lines to self-align the conducting pillars to the conducting lines; and
   forming a multilevel interconnect to the conducting pillars.

2. A method as recited in claim 1 and further comprising;
   photo-etching the gaps prior to formation of the conducting pillars to form a buried contact to the substrate.

3. A method as recited in claim 2 and wherein:
   a space of a width C1 is formed between the conductor lines and the width of the gap formed after depositing the insulating film on the insulating spacers of the sidewalls of the conductor lines equals C1 minus twice the thickness (ts1) of the insulating film, GAP=C1−2(ts1).

4. A method as recited in claim 3 and wherein:
   the width C1 of the space is less than twice the thicknesses of the insulating film (ts1) and the conducting film (tc2), C1<2 (ts1+tc2).

5. A method as recited in claim 4 and further comprising:

photo-etching contact vias into the insulator deposited on the conducting layer.

6. A method of forming parallel spaced self-aligned conducting pillars in a semiconductor integrated circuit for forming a multilevel interconnect comprising:
depositing a conducting layer on a silicon substrate having a gate oxide layer formed thereon;
depositing an insulator oxide on the conducting layer;
photo-etching to form parallel spaced conducting lines in the conducting layer having spaces of a width C1 therebetween;
conformally depositing and anisotropically etching an insulator oxide to form insulating spacers on the sidewalls of the parallel spaced conducting lines while leaving gaps therebetween;
conformally depositing a conducting film to a thickness of tc2 over the parallel spaced conducting lines and into the gaps to completely fill the gaps;
blanket etching the wafer stopping the etch after etching approximately a thickness of the conducting film tc2 to form planarized conducting pillars;
photo-etching the conducting pillars over-sizing a photo-mask parallel to the conducting pillars thereby self-aligning the conducting pillars for contact to the conducting lines; and
forming a multilevel interconnect to the conducting pillars;
whereby the conducting pillars may be utilized to form a multilevel interconnect between the conducting lines and another conducting line.

7. A method as recited in claim 6 and further comprising:
photo-etching buried contacts into the conducting layer formed on the silicon substrate in the spaces between conducting lines prior to formation of the conducting pillars whereby the conducting pillars contact the buried contacts.

8. The method as recited in claim 7 and wherein:
the gap between conducting lines is equal to a space (C1) between the conducting lines minus twice a thickness (ts1) of the insulating spacers ($GAP = C1 - (2 \times ts1)$).

9. The method as recited in claim 8 and wherein:
the space (C1) is less than twice the thickness of the insulating spacers (ts1) plus a thickness of the conducting film (tc2): $C1 < 2 \times (ts1 + tc2)$.

10. The method as recited in claim 9 and further comprising:
photo-etching and forming contacts into the conducting lines.

11. The method as recited in claim 10 and wherein:
the conducting lines are formed of a composite film of tungsten silicide (WSiX) and polysilicon.

12. The method as recited in claim 10 and wherein:
the conducting film has a thickness (tc2) greater than one-half of the gap between conductor lines.

13. The method as recited in claim 9 and wherein:
the conducting line is a word line and another conducting line is a digit line.

* * * * *